(12) United States Patent
Murakami

(10) Patent No.: US 6,363,846 B1
(45) Date of Patent: Apr. 2, 2002

(54) SCREEN PRINTING APPARATUS HAVING A CAMERA APPARATUS

(75) Inventor: Takehiko Murakami, Inagi (JP)

(73) Assignee: Minami Co. Ltd., Tokyo (JP)

( * ) Notice: Subject to any disclaimer, the term of this patent is extended or adjusted under 35 U.S.C. 154(b) by 0 days.

(21) Appl. No.: 09/633,594

(22) Filed: Aug. 7, 2000

(30) Foreign Application Priority Data

Aug. 30, 1999 (JP) .............................. 11-243066

(51) Int. Cl.[7] ................................ B41L 13/02
(52) U.S. Cl. ...................... 101/126; 101/123
(58) Field of Search ................ 101/114, 115, 101/123, 124, 126, 127.1, 129; 348/125, 131, 94, 95; 356/399, 400

(56) References Cited

U.S. PATENT DOCUMENTS

| | | | | |
|---|---|---|---|---|
| 4,782,751 A | * | 11/1988 | Colapinto | 101/126 |
| 5,176,076 A | * | 1/1993 | Azuma et al. | 101/123 |
| 5,176,078 A | * | 1/1993 | Homma et al. | 101/126 |
| 5,740,729 A | * | 4/1998 | Hikita et al. | 101/126 |
| 5,825,495 A | * | 10/1998 | Huber | 356/371 |
| 6,202,551 B1 | * | 3/2001 | Murakami | 101/126 |

* cited by examiner

*Primary Examiner*—Leslie J. Grohusky
(74) *Attorney, Agent, or Firm*—R. Neil Sudol; Henry D. Coleman; William J. Sapone

(57) ABSTRACT

A screen printing apparatus is configured to perform a printing operation and a checking and inspecting of the state of print on a substrate. A mask frame and a camera apparatus for checking and inspecting the print state are arranged along a direction of transfer of the substrate so as to be disposed in parallel to each other. After the substrate receives a printed pattern by operation of a squeegee apparatus, the substrate is moved by substrate support tables to a checking and inspecting station. The supporting tables are arranged below the mask frame and the camera apparatus.

1 Claim, 4 Drawing Sheets

SCREEN PRINTING APPARATUS HAVING A CAMERA APPARATUS

BACKGROUND OF THE INVENTION

1. Field of the Invention

The present invention relates to a screen printing apparatus, and more particularly to a screen printing apparatus which is structured such that a printing operation and a checking and inspecting operation of a print state can be performed in a flow work.

2. Description of the Prior Art

A substrate such as a printed circuit board is fed to a next mounting step after a printing agent such as a creamed solder or the like is applied in a predetermined pattern by a screen printing apparatus, and electronic parts are mounted thereon.

However, if an accurately right printing is not applied in the printing step in accordance with a predetermined pattern, the substrate on which the electronic parts are mounted becomes inferior. Accordingly, a checking and inspecting operation of the print state is performed at a time when the printing is finished.

Then, the checking and inspecting operation is conventionally performed after moving the substrate to another test machine after the printing is finished. Accordingly, a loss time is generated and a whole work flow is deteriorated.

SUMMARY OF THE INVENTION

The present invention is made by taking the points mentioned above into consideration, and an object of the present invention is to provide a screen printing apparatus which is structured such that a printing operation and a checking and inspecting operation of a print state can be performed in a flow work.

Then, in accordance with a gist of the present invention, there is provided a screen printing apparatus comprising:

a mask frame;

a camera apparatus for a checking and inspecting operation of a print state in a substrate, the camera apparatus being arranged in parallel to the mask frame along a direction of transferring the substrate and capable of moving in a transfer direction of the substrate and a direction perpendicular to the transfer direction;

a squeegee apparatus having a fixed support plate arranged above the mask frame, a squeegee support plate mounted to the fixed support plate and moving along the transfer direction of the substrate at a proper timing, and a squeegee mounted to the squeegee support plate and vertically moving at a proper timing; and a substrate supporting table arranged below the mask frame and the camera apparatus for the check and inspection of the print state in the substrate, capable of moving in the transfer direction of the substrate and the direction perpendicular to the transfer direction and capable of vertically moving and rotating in a horizontal direction.

Further, the structure is made such that the camera apparatus for the check and inspection of the print state in the substrate is constituted by an irradiating apparatus structured such that a light emitting body comprising a light emitting diode (LED) is arranged so as to direct in an opposite side to the substrate and covered with a semispherical cap, on the top portion of which a photographing hole having a predetermined diameter is provided and on an inner surface of which a light reflection is suitably restricted, thereby a light of the light emitting body irradiating on the substrate after reflecting on the inner surface of the semispherical cap, and by a charge coupled device (CCD) camera arranged above the irradiating apparatus. Accordingly, since the light of the light emitting body can be irradiated softly by an indirect lighting, and a halation is not generated, it is possible to accurately photograph the print state by the CCD camera. Therefore, it is possible to accurately check and inspect the print state.

DESCRIPTION OF THE PREFERRED EMBODIMENT

A description will be given below of an embodiment in accordance with the present invention with reference to the accompanying drawings.

Figure 1:
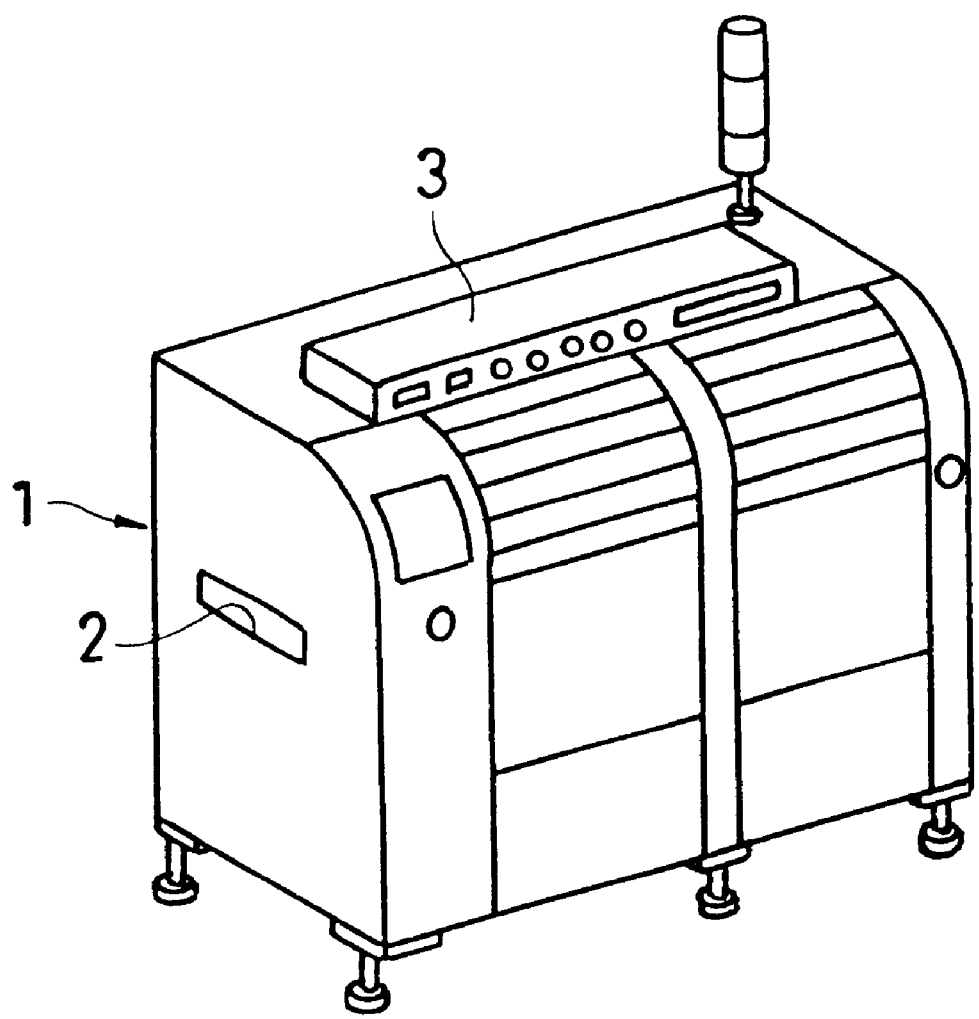
FIG. 1 is a perspective view of a whole structure in accordance with the present invention.
Figure 2:
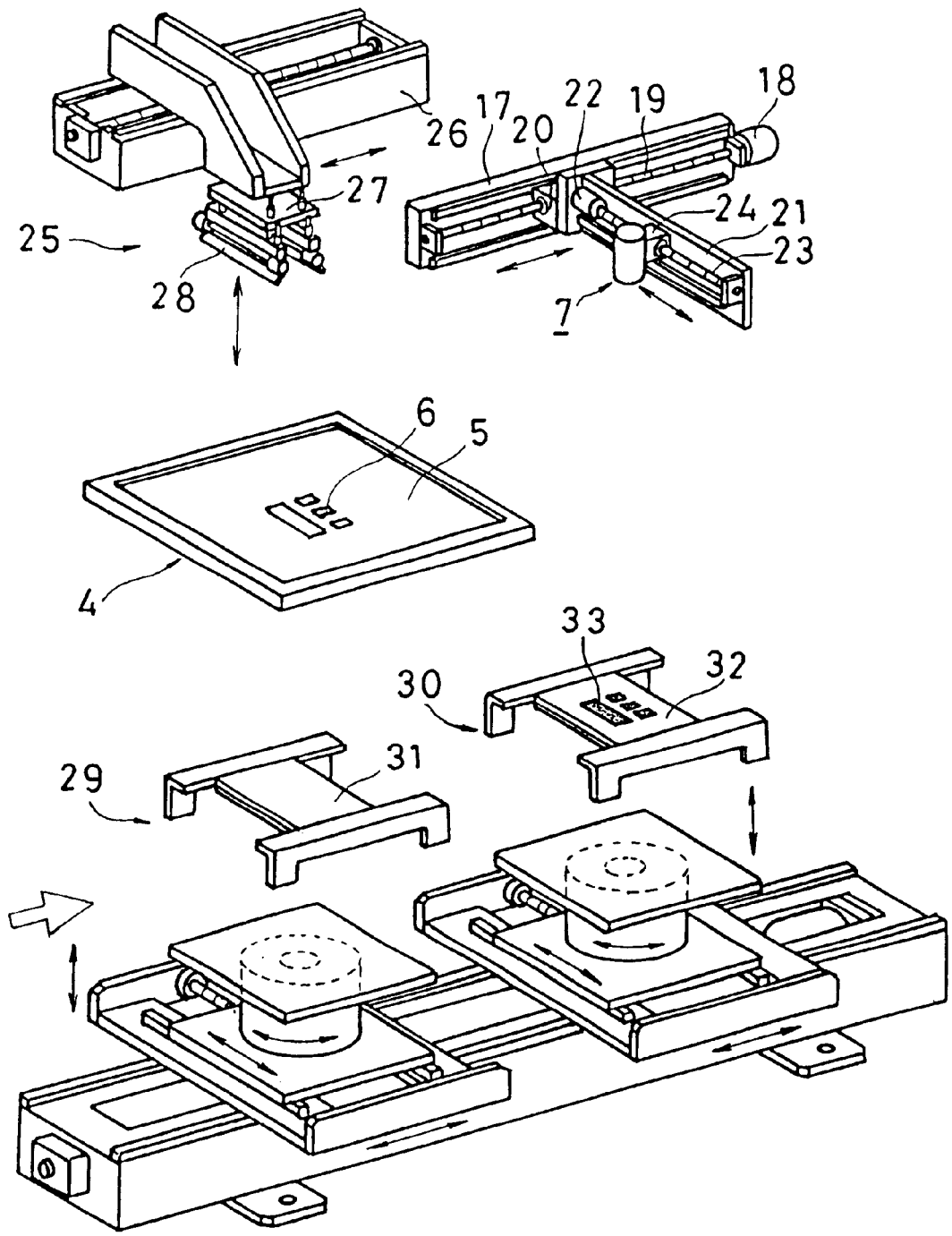
FIG. 2 is an exploded perspective view of a main portion.
Figure 3:
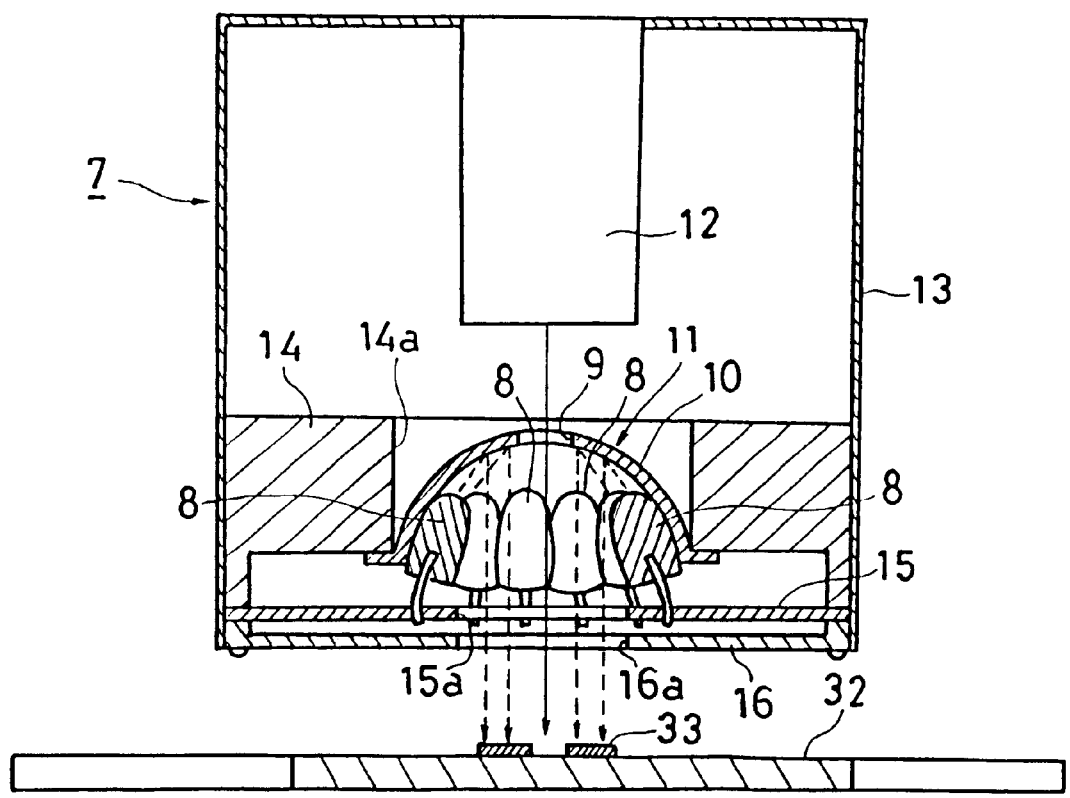
FIG. 3 is an enlarged cross sectional view of a print state checking and inspecting camera apparatus for a substrate.
Figure 4:
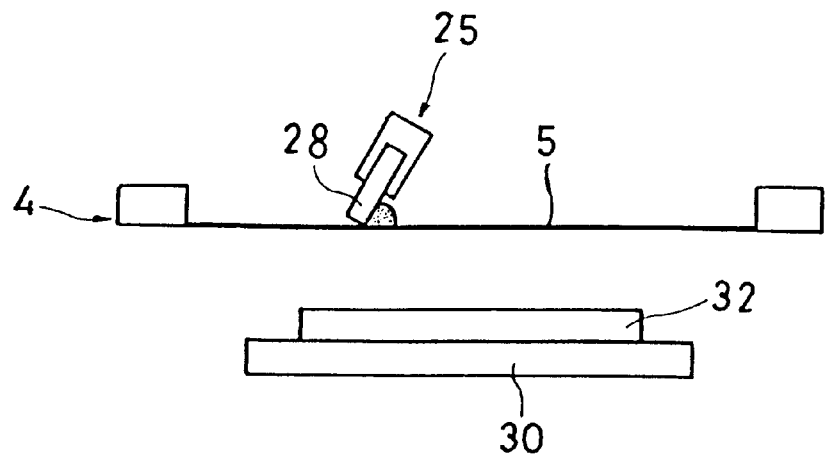
FIG. 4 is a view for explaining an operation of the present invention, which shows a state being printed by a squeegee apparatus.
Figure 5:
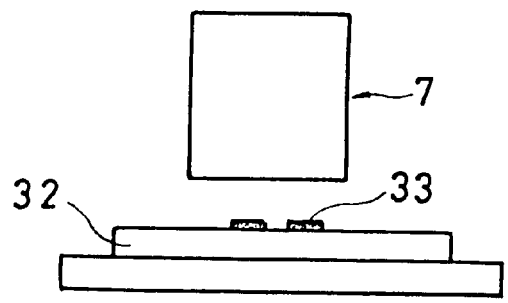
FIG. 5 is a view for explaining an operation of the present invention, which shows a state that a print state is checked and inspected by the print state checking and inspecting camera apparatus for the substrate.

FIG. 1 is a perspective view of a whole structure, FIG. 2 is an exploded perspective view, FIG. 3 is an enlarged cross sectional view of a print state checking and inspecting camera apparatus for a substrate, FIG. 4 is a view for explaining an operation thereof, which shows a state being printed by a squeegee apparatus and FIG. 5 is a view for explaining an operation thereof, which shows a state that a printing state is checked and inspected by the print state checking and inspecting camera apparatus for the substrate.

In the drawings, reference numeral 1 denotes a case of a printing apparatus. Reference numeral 2 denotes an inlet port for a substrate such as a printed circuit board or the like, which is provided in the case 1. Further, reference numeral 3 denotes a control panel.

Reference numeral 4 denotes a mask frame for fixing a mask 5. Further, the mask frame 4 is supported by conventionally known means (not shown). In this case, reference numeral 6 denotes a printing pattern formed on the mask 5.

Reference numeral 7 denotes a print state checking and inspecting camera apparatus for a substrate. The substrate print state checking and inspecting camera apparatus 7 is constituted by an irradiating apparatus 11 structured such that a light emitting body 8 comprising a light emitting diode (LED) is arranged so as to direct in an opposite side to the substrate and covered with a semispherical cap 10, on the top portion of which a photographing hole 9 having a predetermined diameter is provided and on an inner surface of which a light reflection is suitably restricted, thereby a light of the light emitting body 8 irradiating on the substrate after reflecting on the inner surface of the semispherical cap 10, and by a charge coupled device (CCD) camera 12 arranged above the irradiating apparatus 11. Further, reference numeral 13 denotes a cylindrical cover body. Reference numeral 14 denotes a supporting body for the semispherical cap 10. The supporting body has a receiving hole 14a for the cap. Reference numeral 15 denotes a supporting plate for the light emitting body 8. The supporting plate has a light through hole 15a at a center portion thereof. Reference numeral 16 denotes a top plate for the cover body 13. The top plate has a light through hole 16a having the same diameter as that of the light through hole 15a at a center portion thereof.

Further, the print state checking and inspecting camera apparatus 7 for the substrate is arranged along a transfer direction of the substrate so as to be in parallel to the mask frame 4 and can move in the transfer direction of the substrate and a direction perpendicular to the transfer direction.

Further, in accordance with the present embodiment, a moving mechanism is constituted by a fixed support plate 17 arranged along the transfer direction of the substrate, a rotational screw shaft 19 mounted to the fixed support plate 17 and rotated by a motor 18, a moving support plate 21 protruded in a direction perpendicular to the fixed support plate 17 having a slider 20 fitted to the rotational screw shaft 19 in a base portion, a rotational screw shaft 23 mounted to the moving support plate 21 and rotated by a motor 22, and a slider 24 mounted to the substrate print state checking and inspecting camera apparatus 7 and fitted to the rotational screw shaft 23.

Reference numeral 25 denotes a squeegee apparatus. In this case, the squeegee apparatus 25 is structured in the same manner as that of the conventionally known squeegee apparatus, and is constituted by a fixed support plate 26 arranged above the mask frame 4, a squeegee support plate 27 mounted to the fixed support plate 26 and moving along the transfer direction of the substrate at a proper timing, and a squeegee 28 mounted to the squeegee support plate 27 and vertically moving at a proper timing.

Reference numerals 29 and 30 denote a substrate supporting table arranged below the mask frame 4 and the substrate print state checking and inspecting camera apparatus 7. The substrate supporting tables 29 and 30 are structured such that they can move in the transfer direction of the substrate and the direction perpendicular to the transfer direction and can vertically move and rotate in a horizontal direction. Further, in the drawings, reference numeral 31 denotes a substrate in a state before being printed, reference numeral 32 denotes a substrate after being printed, and reference numeral 33 denotes a printed pattern.

Next, a description will be given of an operation of the present embodiment.

As shown in FIG. 4, when a predetermined pattern is printed on the substrate 32 by the mask 5 and the squeegee apparatus 25, the substrate 32 is moved to a position immediately below the substrate print state checking and inspecting camera apparatus 7 as shown in FIG. 5, thereby checking and inspecting the print state by using the camera apparatus.

The print state is checked and inspected by comparing an image of the printed pattern 33 on the substrate 32 photographed by the CCD camera 12 with a pattern previously stored in a computer. Accordingly, a printing miss, a printing position shift and the like can be checked and inspected.

Further, a description will be given of a movement of the substrate at a time of printing, and checking and inspecting the print state. At a time of printing, the table 30 moves upward and the substrate 32 moves near the mask 5. When the printing is finished, the table 30 moves downward and further moves to a position immediately below the substrate print state checking and inspecting camera apparatus 7. Then, the table 30 again moves upward, and the substrate 32 moves near the substrate print state checking and inspecting camera apparatus 7. Then, the print state is checked and inspected. After the check and inspection operation is finished, the table 30 again moves downward and the substrate 32 is taken out.

Since the present invention has the structure and operation mentioned above, it is possible to perform the printing operation and the print state checking and inspecting operation in a flow work. Accordingly, there is no such a loss time as generated in the case of performing the check and inspection by moving the substrate to the independent machine after the printing is finished in accordance with the conventional art, and it is possible to improve a flow of the whole operation.

Further, when employing the substrate print state checking and inspecting camera apparatus stated in the present invention, the light of the light emitting body can be irradiated softly by an indirect lighting, and a halation is not generated, so that it is possible to accurately photograph the printing state by the CCD camera. Therefore, it is possible to accurately check and inspect the print state.

What is claimed is:

1. A screen printing assembly comprising:

a mask frame;

a camera apparatus for checking and inspecting a state of print on a substrate, said camera apparatus being arranged above the substrate in parallel with said mask frame along a direction of transfer of the substrate and capable of moving in said direction of transfer of the substrate and in a direction perpendicular to the transfer direction;

a squeegee apparatus having a fixed support plate arranged above said mask frame, a squeegee support plate mounted on said fixed support plate and moving along the transfer direction of the substrate in accordance with a predetermined timing, and a squeegee mounted on said squeegee support plate and vertically moving in accordance with said predetermined timing; and a substrate supporting table arranged below said mask frame and said camera apparatus and capable of moving in the transfer direction of the substrate and the direction perpendicular to the transfer direction and capable of vertically moving and rotating in a horizontal direction;

wherein said camera apparatus includes:

an irradiating apparatus comprising a plurality of light emitting diodes;

a hemispherical cap provided on a top portion of said irradiating apparatus and having a photographing hole with a predetermined diameter, said hemispherical cap having an inner surface with a predetermined reflectance, light from said light emitting diodes adapted to be irradiated onto the substrate after reflecting from the inner said hemispherical cap; and a charge coupled device disposed above said irradiating apparatus.

* * * * *